(12) United States Patent
Lin et al.

(10) Patent No.: US 7,202,899 B2
(45) Date of Patent: Apr. 10, 2007

(54) METHOD TO PREVENT WHITE PIXELS IN A CMOS IMAGE SENSOR

(75) Inventors: Kuen-Hsien Lin, Ping Tung Shien (TW); Shang-Hsuan Liu, Tai-Tung (TW); Chih-Hsing Chen, Miaoli (TW); Hung Jen Tsai, Hsin chu (TW); Hsien-Tsong Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 587 days.

(21) Appl. No.: 10/152,469

(22) Filed: May 21, 2002

(65) Prior Publication Data

US 2003/0218678 A1  Nov. 27, 2003

(51) Int. Cl.
*H04N 3/14* (2006.01)

(52) U.S. Cl. ............... 348/308; 348/310; 257/291; 257/292; 257/451; 257/466

(58) Field of Classification Search .......... None
See application file for complete search history.

(56) References Cited

U.S. PATENT DOCUMENTS

| | | | |
|---|---|---|---|
| 6,028,330 A * | 2/2000 | Lee et al. ............. | 257/229 |
| 6,040,592 A * | 3/2000 | McDaniel et al. ...... | 257/292 |
| 6,462,365 B1 * | 10/2002 | He et al. ............. | 257/292 |
| 6,649,950 B2 * | 11/2003 | He et al. ............. | 257/292 |
| 6,879,340 B1 * | 4/2005 | Chevallier ........... | 348/207.99 |
| 2001/0034222 A1 * | 10/2001 | Roustaei et al. ....... | 455/403 |
| 2005/0062085 A1 * | 3/2005 | He et al. ............. | 257/292 |

OTHER PUBLICATIONS

Ackland and Dickenson—Camera on a Chip -IEEE-Feb. 8, 1996—pp. 22-26.*

* cited by examiner

*Primary Examiner*—Ngoc-Yen Vu
*Assistant Examiner*—Hung H. Lam
(74) *Attorney, Agent, or Firm*—Tung & Associates

(57) ABSTRACT

A method and system for preventing white pixel difficulties resulting from undesired current induced in an image sensor having a photodiode and a depletion region therein. The photodiode is isolated in a pixel layout for an image sensor. A depletion region is configured, such that the depletion region is maintained in a defect-free region associated with the pixel layout for the image sensor, thereby reducing white pixel difficulties caused by induced and undesired current. The image sensor is preferably a CMOS image sensor. A depletion region of the photodiode is constantly maintained in a defect-free region during operation of the CMOS image sensor.

19 Claims, 3 Drawing Sheets

METHOD TO PREVENT WHITE PIXELS IN A CMOS IMAGE SENSOR

TECHNICAL FIELD

The present invention relates to image sensor devices and fabrication techniques thereof. The present invention additionally relates to CMOS image sensor devices and fabrication techniques thereof. The present invention also relates to methods and systems for reducing leakage current resulting from CMOS image sensor fabrication methods. The present invention particular relates to techniques for reducing unwanted current in CMOS image sensor devices resulting from white pixel difficulties. In particular, the present invention relates to techniques for reducing white pixel difficulties associated with CMOS image sensor devices and fabrication techniques thereof.

BACKGROUND OF THE INVENTION

An image sensor is utilized to convert an optical image focused on the sensor into electrical signals. A typical image sensor includes an array of light detecting elements, where each element produces a signal corresponding to the intensity of light impinging on that element when an image is focused on the array. These signals may then be used, for example, to display a corresponding image on a monitor or otherwise used to provide information about the optical image.

Solid-state image sensors used in, for example, digital video cameras, are presently realized in a number of forms including charge coupled devices (CCDs) and CMOS image sensors. These image sensors are based on a two dimensional array of pixels. Each pixel includes a sensing element that is capable of converting a portion of an optical image into an electronic signal. These electronic signals can then be utilized to regenerate the optical image on, for example, a display.

A CMOS image sensor is thus generally a device that converts an optical image into electrical signals using MOS (Metal Oxide Semiconductor) transistors. As compared with the CCD image sensor, the CMOS image sensor may be easily driven with various scanning schemes and integrated with a signal processing circuit on one-chip. Therefore, the CMOS image sensor may be miniaturize in size and, consequently, a reduction in the fabricating cost and the power consumption may be realized using a compatible CMOS technology.

CMOS image sensors first appeared in 1967. However, CCDs have prevailed since their invention in 1970. Both solid-state imaging sensors depend on the photovoltaic response that results when silicon is exposed to light. Photons in the visible and near-IR regions of the spectrum have sufficient energy to break covalent bonds in silicon. The number of electrons released is proportional to the light intensity. Even though both technologies use the same physical properties, all-analog CCDs dominate vision applications because of their superior dynamic range, low fixed-pattern noise (FPN), and high sensitivity to light.

More recently, however, CMOS image sensors have gained in popularity. CMOS image sensors are widely utilized in videophones, digital cameras, cellular phones, aerospace applications, PC cameras and so forth. The market share of CMOS image sensors is expected to increase in the near future, along with high volume growth for such products. Currently, the most popular pixel array for CMOS image sensors is the VGA format, well known in the art. The mainstream product, however, of CMOS image sensors is expected to be Mega pixel arrays, which are presently in an early state of fabrication.

Pure CMOS image sensors have benefited from advances in CMOS technology for microprocessors and ASICs and provide several advantages over CCD imagers. Shrinking lithography, coupled with advanced signal-processing algorithms, sets the stage for sensor array, array control, and image processing on one chip produced using these well-established CMOS techniques. Shrinking lithography can also decrease image-array cost due to smaller pixels. However, pixels cannot shrink too much, or they have an insufficient light-sensitive area. Nonetheless, shrinking lithography provides reduced metal-line widths that connect transistors and buses in the array. This reduction of metal-line widths exposes more silicon to light, thereby increasing light sensitivity. CMOS image sensors also provide greater power savings, because they require fewer power-supply voltages than do CCD imagers. In addition, due to modifications to CMOS pixels, newly developed CMOS image sensors provide high-resolution, low-noise images that compare with CCD imager quality.

CMOS pixel arrays lie at the heart CMOS image sensors. CMOS pixel-array construction utilizes active or passive pixels. Active-pixel sensors (APS) include amplification circuitry in each pixel. Passive pixels use photodiodes to collect the photo charge, whereas active pixels can include either photodiode or photo gate light sensitive regions.

The first image-sensor devices used in the 1960s were passive pixel arrays. Each pixel of a passive pixel array includes a photodiode for converting photon energy to free electrons, and an access transistor for selectively connecting the photodiode to a column bus. After photo charge integration in the photodiode, an array controller turns on the access transistor. The charge stored in the photodiode transfers to the capacitance of the column bus, where a charge-integrating amplifier at the end of the bus senses the resulting voltage. The column bus voltage resets the photodiode, and the controller then turns off the access transistor. The pixel is then ready for another integration period.

A CMOS image sensor may be formed as an integrated circuit using a CMOS process. In such a CMOS type image sensor, a photodiode or phototransistor (or other suitable device) can be utilized as the light-detecting element, where the conductivity of the element corresponds to the intensity of light impinging on the element. The variable signal thus generated by the light-detecting element is generally an analog signal whose magnitude is approximately proportional (within a certain range) to the amount of light impinging on the element. It is known to form these light-detecting elements in a two-dimensional core array, which is addressable by row and column. Once a row of elements has been addressed, the analog signals from each of the light detecting elements in the row are coupled to the respective columns in the array. An analog-to-digital converter (ADC) may then be utilized to convert the analog signals on the columns to digital signals so as to provide only digital signals at the output of the image sensor chip.

Using current fabrication technology, it is well known that defects in the substrate cause leakage current between the gate electrodes of the image sensor, especially where the substrate defects are caused by plasma damage. It is therefore of key importance to produce a substrate surface that is free of damage and, more particularly, to be able to perform spacer etching without causing damage to the substrate surface. Current practice uses a single layer of dielectric above the spacer between the gate electrodes of the image sensor. With only a single layer of dielectric, it is difficult to sense and control the etch stop above the substrate. This difficulty in controlling the etching process results in substrate surface damage; this in turn results in leakage current between the gate electrodes of the CMOS image sensor device.

An additional problem can occur during the growth of field oxide. A phenomenon results that causes defects when the gate oxide is grown. This problem is generally referred to as "white pixels". A thin layer of silicon nitride can form on the silicon surface (i.e., the pad-oxide/silicon surface interface). When the gate oxide is grown, the growth rate becomes impeded at the locations where the silicon nitride has been formed. The gate oxide is thus thinner at these locations than elsewhere, causing low-voltage breakdown of the gate oxide.

Based on the foregoing, it can be appreciated that a great deal of work thus remains in reducing white pixels in the development of CMOS image sensors. The present inventors realize that a significant cause of white spot problems (i.e., white pixels) in CMOS image sensors is excessive current leakage from light-sensitive (e.g., photodiode) regions. In particular, such white pixels are caused by the so-called "bird's beak" effect (i.e., bird's beak induced unwanted current). Excessive and unwanted current leakage can occur in regions that are subjected to excessive mechanical stress during fabrication, and to regions that are subjected to excessive electrical stress during device operation.

The "bird's beak" effect is associated with attempts to isolate semiconductor devices from one another. One of the most significant efforts in the design of electronic systems is the continuing effort to fit more and more active devices within a particular area of a semiconductor substrate. This effort involves the reduction of the minimum geometries of semiconductor devices. Additionally, a reduction in the spacing between adjacent semiconductor devices also aids in increasing the density of the active surface area of a semiconductor substrate. If semiconductor devices are positioned too close to one another on a semiconductor substrate, parasitic capacitances and current can develop which can degrade the performance of the circuit as a whole. As such, a great deal of effort has gone into designing methods and structures to electronically isolate adjacent semiconductor devices while still allowing the semiconductor devices to be positioned closely to one another.

One method of isolation that has been utilized is the local oxidation of silicon (LOCOS) technique. Using the LOCOS technique and resulting LOCOS structures, the surface of the active semiconductor substrate is oxidized between active regions of the semiconductor surface to prevent the electronic interaction of adjacent devices. The effectiveness of the LOCOS technique degrades significantly as devices become closer and closer together due to parasitic currents that can develop between adjacent devices beneath the LOCOS structures. These currents are referred to as "punch-through" currents and travel through the bulk semiconductor beneath the LOCOS structures. The formation of such LOCOS structures often results in the formation of so-called "birds beak" structures, well known in the art. It is the formation of such bird's beak structures that often results in unwanted currents, which in turn contributes to white pixel problems in CMOS image sensor devices.

The present inventors have thus concluded, based on the foregoing, that a need exists for a method and system for avoiding white pixel problems caused by unwanted current, particular current induced as a result of the "bird's beak" effect. The present inventors have solved this problem through the design and implementation of a unique "smart pixel" layout for CMOS image sensors products, which results in a reduction in white pixel without any additional costs, which is significant departure from the earlier attempts to address white pixel issues.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide improved image sensor devices and fabrication techniques thereof.

It is another aspect of the present invention to provide improved CMOS image sensor devices and fabrication techniques thereof.

It is yet another aspect of the present invention to provide a method and system for reducing leakage current resulting from CMOS image sensor fabrication methods.

It is an additional aspect of the present invention to provide a method and systems for reducing unwanted current in CMOS image sensor devices resulting from white pixel difficulties.

It is still another aspect of the present invention to provide a method and system for reducing white pixel difficulties associated with CMOS image sensor devices and fabrication techniques thereof.

The above and other aspects of the present invention are achieved as is now described. A method and system are disclosed herein for preventing white pixel difficulties resulting from undesired current induced in an image sensor having a photodiode and a depletion region therein. The photodiode is isolated in a pixel layout for an image sensor. A depletion region is configured, such that the depletion region is maintained in a defect-free region associated with the pixel layout for the image sensor, thereby reducing white pixel difficulties caused by induced and undesired current. The image sensor is preferably a CMOS image sensor. A depletion region of the photodiode is constantly maintained in a defect-free region during operation of the CMOS image sensor. The white pixel difficulties that are reduced in accordance with the methods and systems of the present invention are generally the result of a "bird's beak" induced unwanted current. The photodiode itself may comprise an N-well photodiode, and the CMOS image sensor may be configured in accordance with a mega pixel array format. The present invention thus isolates the photodiodes and keeps the depletion away from the "bird's beak," by maintaining the depletion region always in a defect-free region.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
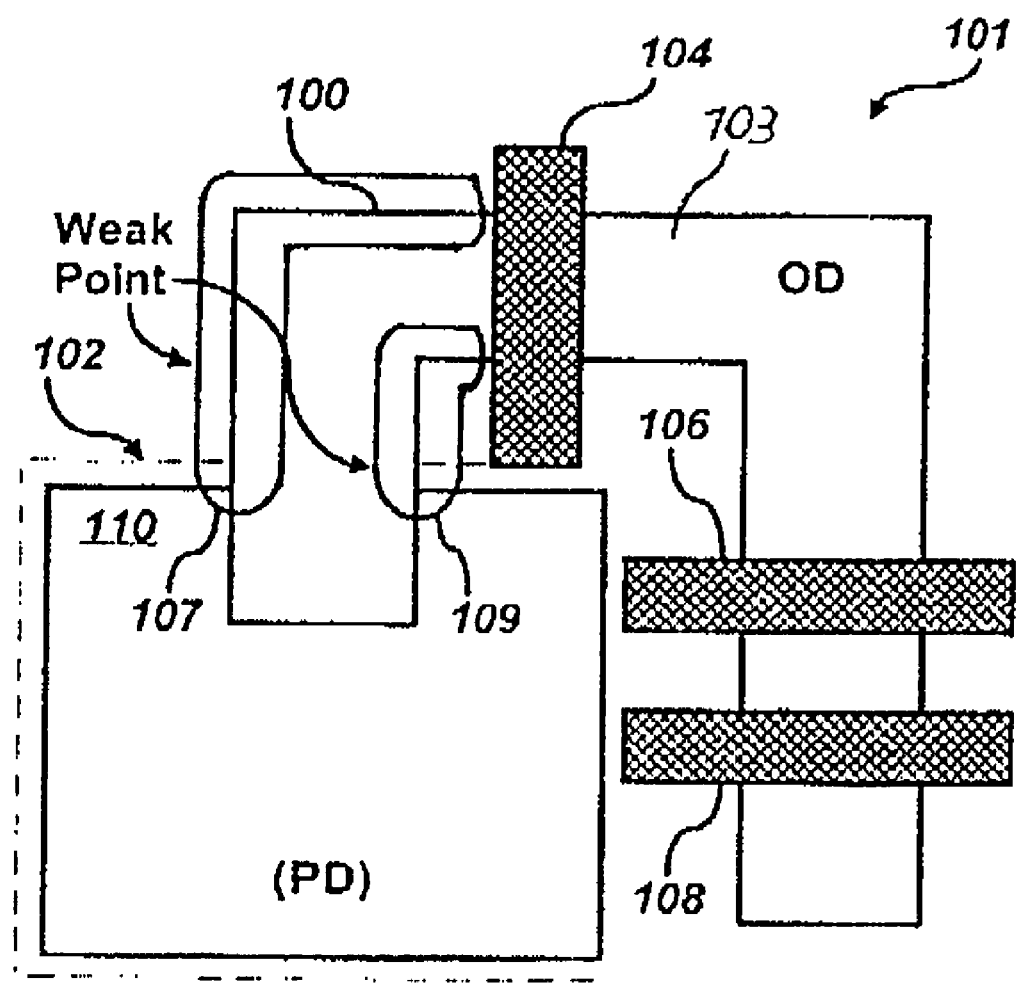
FIG. 1 shows an exemplary top view of a portion of an active pixel layout on a semiconductor substrate according to the prior art.

Referring to FIG. 1 is shown a schematic of an active pixel layout 101 according to the prior art. Shown are transistors (polygate regions) 108, 106, 104, making up circuitry associated with the active pixel region. The transistors are electrically connected by an active region (OD) 103, which in turn connects to a photodiode region 110 (PD). The active region (OD) 103 is formed in the semiconductor substrate and is typically electrically isolated on either side by structures such as LOCOS (local oxidation of silicon) extending into the semiconductor substrate (e.g., Si) over the photodiode (PD) 110 area. As a result, defective portions of the substrate are forme at the edges, e.g., 100, forming "weak points" (defective edges), e.g., 107 and 109 along the active region (OD) 103 and extending across the depletion region 102, resulting in a defective depletion region.

Figure 2:
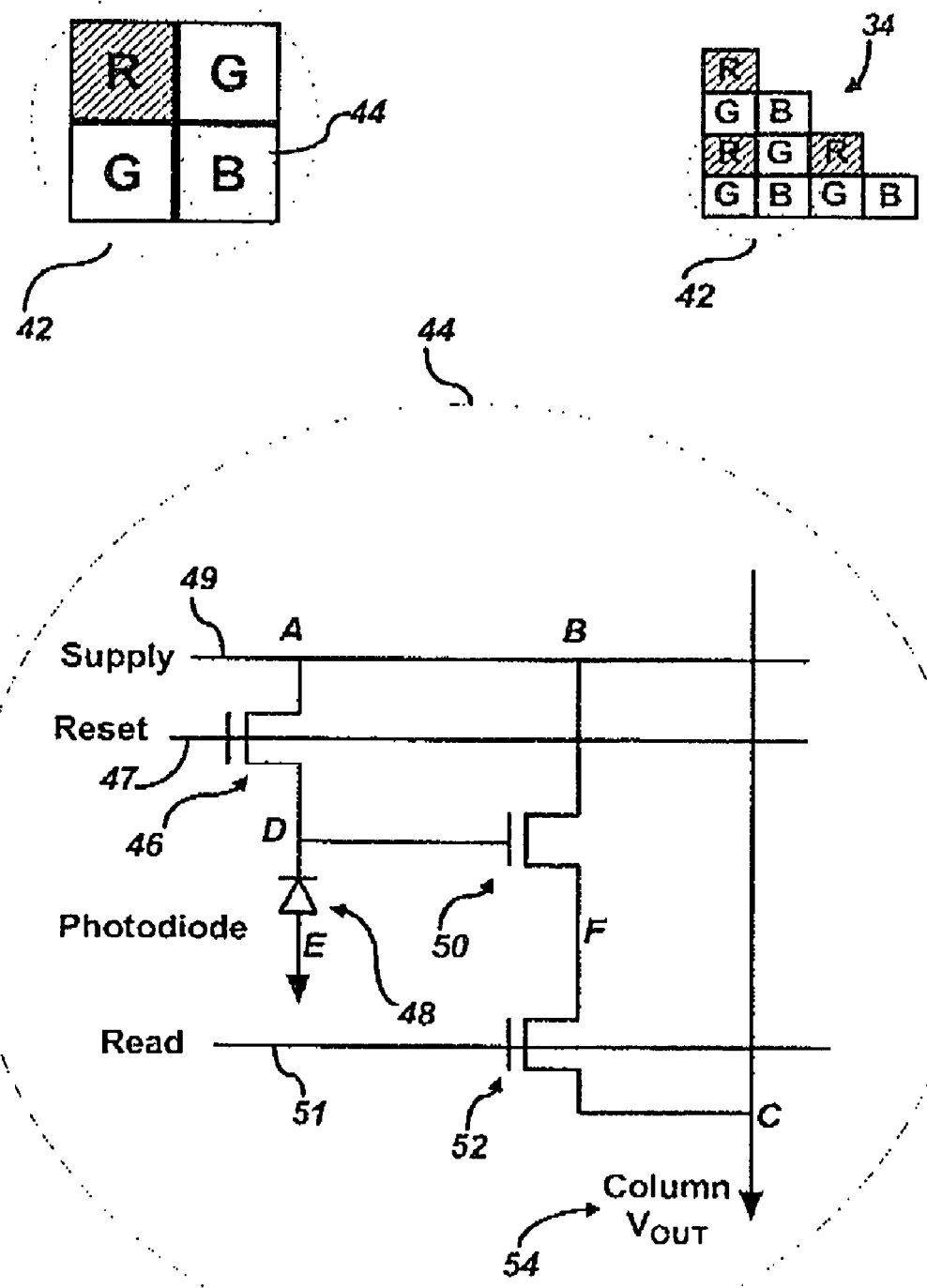
FIG. 2 illustrates a schematic diagram illustrative of an active pixel circuit that may be implemented with the CMOS image sensor chip architecture depicted in FIG. 2, including a circuit diagram in accordance with a preferred embodiment of the present invention.

FIG. 2 illustrates a top view of a CMOS image sensor reference pixel configuration 34, in accordance with a preferred embodiment of the present invention. Configuration 34 illustrates a pixel layout for an image sensor comprising a pixel array 34. Each array 42 of pixel array 34 generally includes an active pixel circuit, which is described and illustrated in greater detail herein below.

CMOS image sensor reference pixel configuration 34 can be generally arranged to implement a CMOS solid-state color image sensor. In such devices, a complementary color filter pattern is often used. Arrays of pixels, which form pixel array 42, may be made to detect color by being covered with a regular pattern of color filter patches, known as a color filter pattern. The filter patches can be fabricated directly on the sensor or on a transparent substrate, which is later cemented to the chip. Color filter patterns may include colors such as red, green, blue, yellow, cyan and magenta.

The pixels beneath the color filter pattern can emit signals when they are exposed to the type of light indicated by the color filter patch. Thus, a red signal can be obtained from a pixel beneath a red filter patch, a blue signal can derive from a pixel beneath a blue filter patch, and so forth. Those skilled in the art can appreciate that the CMOS image sensor described herein may be implemented in accordance with a variety of pixel configurations. The foregoing description of a CMOS solid-state color image sensor is thus described herein for illustrative purposes only and is not a limiting feature of the present invention.

The CMOS image sensor chip architecture may include a vertical decoder 24 (not shown) that communicates with a plurality of active pixel circuits 34 (shown in FIG. 2) and a timing device (not shown). The timing device may be connected to a horizontal decoder that in turn may be connected to a column-based analog-to-digital converter (not shown). The column-based analog-to-digital converter may be generally connected to the plurality of active pixel circuits 34. The analog-to-digital converter provides digital signals at an output of the CMOS image sensor. These digital signals can be transmitted to the system in which the CMOS image sensor is implemented. Such a system can be, for example, a device such as a videophone, digital camera, cellular phone, PC camera, and so forth.

FIG. 2 illustrates a schematic diagram illustrative of an active pixel circuit 44 that may be implemented with the CMOS image sensor chip architecture 203 depicted in FIG. 3 below, in accordance with a preferred embodiment of the present invention. Each active pixel circuit 44 may be implemented within the plurality of active pixel circuits 34. For explanatory purposes only, those skilled in the art can appreciate that the active pixel circuit 44 is also illustrated in FIG. 2 as a close-up view including an associated circuit diagram. Region 42 thus includes a variety of active pixel circuits, one of which is illustrated as active pixel circuit 44.

Active pixel circuit 44 thus generally includes a first transistor 46, which is connected at its input to a reset line 47. First transistor 46 is also linked to a supply line 49 at node A and a photodiode 48 at node D. Node E of photodiode 48 can comprise a first node of photodiode 48, while Node D can comprise a second node of photodiode 48. Node E of photodiode D is linked to ground. Such a photodiode may comprise an N-well photodiode. Node D is also connected to an input to a second transistor 50. A first node of the second transistor 50 is linked to supply line 49 at node B, which in turn is linked to node A. Thus, node A and node B generally comprise an equivalent connecting node.

Additionally a read line 51 is generally connected to an input of a third transistor 52. Second transistor 50 is generally connected to third transistor 54 at node F. Node F can comprise a second node of second transistor 50 and a first node of third transistor 52. Finally, node C, which comprises a second node of third transistor 52 is generally connected to an output voltage 54. That is, an output voltage is provided at node C, wherein the output voltage provides column data derived from the pixel array 42 illustrated in FIG. 2. In the configuration illustrated in FIG. 3 photodiode 230 is preferably isolated to prevent the development of white pixels caused by "bird's beak" induced unwanted current. Transistors 46, 50, and 52 can be configured as CMOS transistors, thereby e.g., corresponding respectively to polygate regions e.g., 224, 226, and 228 in FIG. 3 thereby implementing a CMOS image sensor device.

Figure 3:
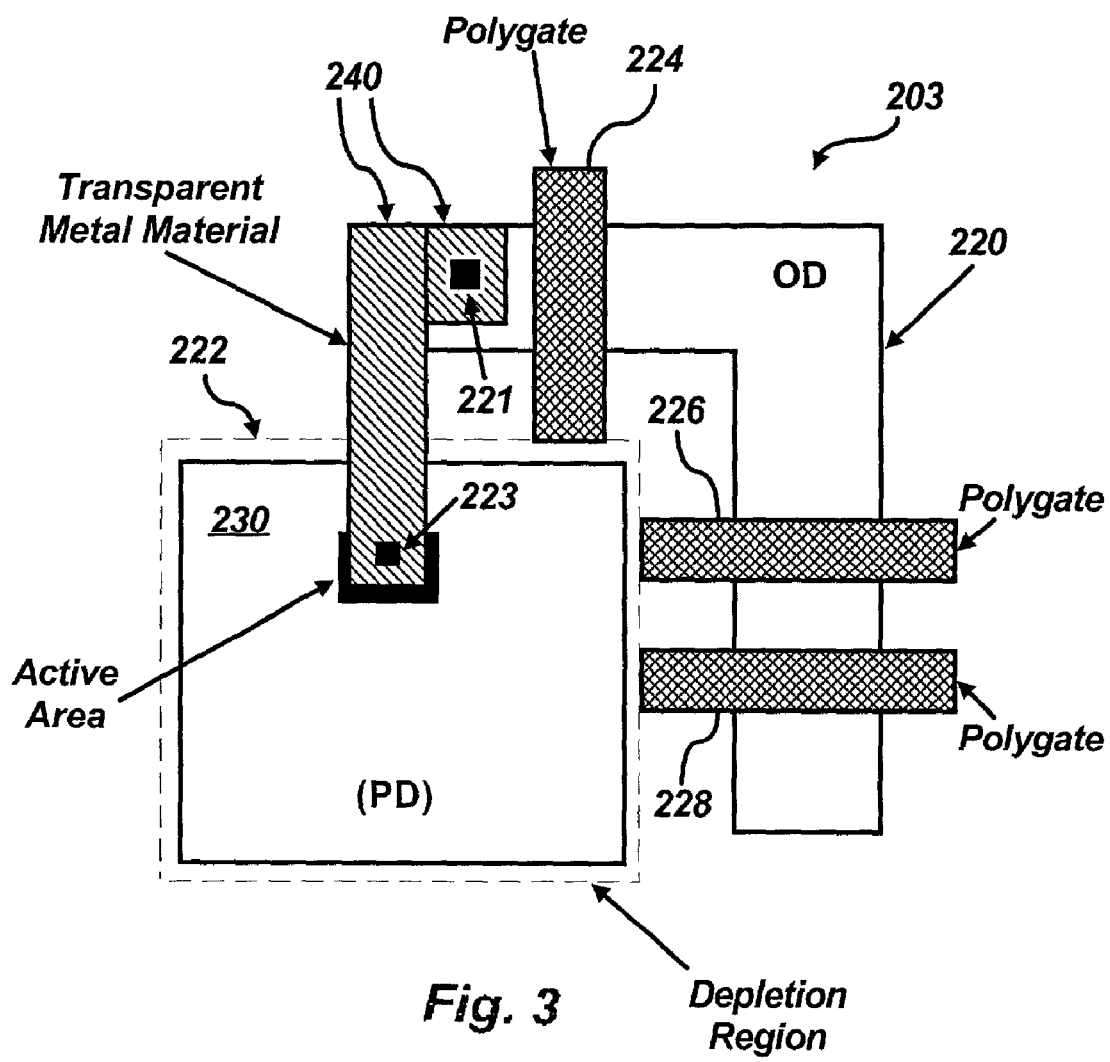
FIG. 3 illustrates a block schematic top view of a photodiode and associated active pixel region formed on a semiconductor substrate according to an embodiment of the present invention.

Referring to FIG. 3, according to an aspect of the invention, a defect-free depletion region 222 of the photodiode (PD) area 230 is achieved and constantly maintained by replacing the active area connection (in the semiconductor substrate) from the (PD) area 230 including photodiode transistor 223 to the active area of associated circuitry (OD) 220 according to a transparent conductor (metal) material 240 formed over the surface of the semiconductor substrate including photodiode transistor 223 and extending to a contact 221 formed over the active area (OD) 220. As a result, the depletion region 222 is maintained in a defect-free region of the semiconductor substrate and increases the light sensitive area of the photodiode according to the transparent metal connection 240.

The present invention thus discloses a method and system for preventing white pixel difficulties resulting from undesired current induced in an image sensor having a photodiode and a depletion region therein. The photodiode is isolated in a pixel layout for an image sensor. A depletion region is configured, such that the depletion region is maintained in a defect-free region associated with the pixel layout for the image sensor, thereby reducing white pixel difficulties caused by induced and undesired current. The image sensor is preferably a CMOS image sensor. A depletion region of the photodiode is constantly maintained in a defect-free region during operation of the CMOS image sensor. The white pixel difficulties that are reduced in accordance with the methods and systems of the present invention are generally the result of a "bird's beak" induced unwanted current. The photodiode itself may comprise an N-well photodiode, and the CMOS image sensor may be configured in accordance with a mega pixel array format. The present invention thus isolates the photodiodes and keeps the depletion away from the "bird's beak," by maintaining the depletion region always in a defect-free region.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

The invention claimed is:

1. A method for preventing white pixel difficulties resulting from undesired current induced in an CMOS image sensor having a photodiode and a depletion region therein, said method comprising the steps of:
   isolating said photodiode in a pixel layout for an image sensor; and
   configuring a depletion region of said photodiode, such that said depletion region is maintained in a defect-free region of a semiconductor substrate associated with said pixel layout for said image sensor, said defect-free region maintained according to formation of an electrical connection comprising a transparent conductor material formed over the semiconductor substrate from said photodiode to an adjacent active region of an active pixel circuit.

2. The method of claim 1 further comprising the step of:
   constantly maintaining a depletion region of said photodiode in a defect-free region during operation of said CMOS image sensor.

3. The method of claim 1 wherein said photodiode is isolated according to LOCOS isolation comprising a bird's beak.

4. The method of claim 1 wherein said photodiode comprises an N-well photodiode.

5. The method of claim 1 wherein said CMOS image sensor comprises a mega pixel array format.

6. The method of claim 1 wherein said pixel layout for said image sensor comprises at least one peripheral circuit comprising said active pixel circuit.

7. The method of claim 1 further comprising the step of configuring said active pixel circuit, said active pixel circuit comprising a plurality of active pixels, by:
   connecting a first transistor to a reset line and a supply line and a photodiode;
   linking a first node of said photodiode to ground and a second node of said photodiode to said first transistor and an input to a second transistor;
   connecting a read line to an input of a third transistor;
   linking a first node of said second transistor to said supply line and a second node of said second transistor to a first node of said third transistor; and
   connecting a second node of said third transistor to an output voltage.

8. The method of claim 1, wherein said transparent conductor material comprises a metal.

9. A method for preventing white pixel difficulties resulting from undesired current induced in a CMOS image sensor having a photodiode and a depletion region therein, said method comprising the steps of;
   isolating said photodiode in a pixel layout for a CMOS image sensor, wherein said photodiode comprises an N-well photodiode and said CMOS image sensor is configured based on a mega pixel array format; and
   configuring a depletion region associated with said photodiode by forming a transparent metal containing conductor extending over said depletion region to an adjacent active pixel circuit, such that said depletion region is maintained in a defect-free region associated with said pixel layout for said CMOS image sensor, thereby reducing white pixel difficulties caused by a bird's beak induced undesired current.

10. A system for preventing white pixel difficulties resulting from undesired current induced in an CMOS image sensor having a photodiode and a depletion region therein, said system comprising:
    a photodiode isolated in a pixel layout comprising a plurality of active pixels for an image sensor; and
    a depletion region maintained in a defect-free region of a semiconductor substrate associated with said pixel layout for said image sensor, said defect-free region maintained according to a transparent conductor connection from said photodiode to an adjacent active pixel circuit, thereby reducing white pixel difficulties caused by induced and undesired current.

11. The system of claim 10 wherein said depletion region of said photodiode is constantly maintained in said defect-free region during operation of said CMOS image sensor.

12. The system of claim 10 wherein said photodiode is isolated according to LOCOS isolation comprising a bird's beak.

13. The system of claim 10 wherein said photodiode comprises an N-well photodiode.

14. The system of claim 10 wherein said CMOS image sensor is configured in accordance with a mega pixel array format.

15. The system of claim 10 wherein said pixel layout including said active pixel circuit for said image sensor comprises at least one adjacent peripheral circuit.

16. The system of claim 10 wherein said active pixel circuit of said plurality of active pixels comprises:
    a first transistor connected to a reset line and a supply line and a photodiode;
    a first node of said photodiode linked to ground and a second node of said photodiode linked to said first transistor and an input to a second transistor;
    a read line connected to an input of a third transistor;
    a first node off said second transistor linked to said supply line and a second node of said second transistor to a first node of said third transistor; and a second node of said third transistor connected to an output voltage.

17. The system of claim 10, wherein said transparent conductor comprises a metal.

18. A system for preventing white pixel difficulties resulting from undesired current induced in a CMOS image sensor having a photodiode and a depletion region therein, said system comprising:

a photodiode isolated in a pixel layout for a CMOS image sensor, wherein said photodiode comprises an N-well photodiode and wherein said CMOS image sensor is configured based on a mega pixel array format; and a depletion region in a semiconductor substrate associated with said photodiode, such that said depletion region is maintained in a defect-free region associated with said pixel layout for said CMOS image sensor, said defect-free region maintained according to a transparent metal containing conductor interconnect line formed over the semiconductor substrate and extending to an associated active area of an adjacent pixel circuit for processing output of said photodiode, thereby reducing white pixel difficulties caused by a bird's beak induced undesired current.

19. The system off claim 18, wherein the photodiode is isolated according to LOCOS comprising a bird's beak.

* * * * *